(12) United States Patent
Lee et al.

(10) Patent No.: US 7,193,291 B2
(45) Date of Patent: Mar. 20, 2007

(54) ORGANIC SCHOTTKY DIODE

(75) Inventors: Tzu-Chen Lee, Woodbury, MN (US);
Michael A. Haase, St. Paul, MN (US);
Paul F. Baude, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 60 days.

(21) Appl. No.: 10/809,135

(22) Filed: Mar. 25, 2004

(65) Prior Publication Data

US 2005/0212072 A1 Sep. 29, 2005

(51) Int. Cl.
*H01L 27/095* (2006.01)
*H01L 29/47* (2006.01)

(52) U.S. Cl. .................. 257/472; 257/476; 257/485

(58) Field of Classification Search ................ 257/471, 257/472, 476, 485, 486
See application file for complete search history.

(56) References Cited

U.S. PATENT DOCUMENTS

| | | | |
|---|---|---|---|
| 6,114,088 | A | 9/2000 | Wolk et al. |
| 2003/0105365 | A1 | 6/2003 | Smith et al. |

FOREIGN PATENT DOCUMENTS

| | | |
|---|---|---|
| EP | 1 017 118 A2 | 7/2000 |
| WO | WO 00/17911 A1 | 3/2000 |

OTHER PUBLICATIONS

E. A. Silinsh and V. Capek, "Organic Molecular Crystals" AIP Press, New York, 1994.

Y. Shirota, T. Kobata, and N. Noma, "Starburst Molecules For Amorphous Molecular Materials, 4,4', 4"-tris(N,N-diphenylamino)triphenylamine and 4,4'4"-Tris(N-(3-methylphenyl)-N-phenylamino)triphenylamine", Chemistry Letters, The Chemical Society of Japan, vol. 7, pp. 1145-1148, 1989.

Yasuhiko Shirota, "Organic Materials for Electronic and Optoelectronic Devices", Journal of Materials Chemistry, vol. 10, pp. 1-25, 2000.

M. Pfeiffer, A. Beyer, T. Frit, and K. Leo, "A Controlled Doping Of Phthalocyanine Layers By Cosublimation With Acceptor Molecules: A Systematic Seebeck And Conductivity Study", Applied Physics Letters, vol. 73, No. 22, pp. 3202-3204, Nov. 30, 1998.

X. Zhou, J. Blochwitz, M. Pfeiffer, A. Nollau, T. Fritz, and K. Leo, "Enhanced Hole Injection Into Amorphous Hole-Transport Layers Of Organic Light-Emitting Diodes Using Controlled P-Type Doping," Advanced Functional Materials, vol. 11, No. 4, pp. 310-314, Aug. 2001.

X. Zhou, M. Pfeiffer, J. Blochwitz, A. Werner, A. Nollau, T. Fritz, and K. Leo, "Very-Low-Operating-Voltage Organic Light-Emitting Diodes Using A P-Doped Amorphous Hole Injection Layer," Applied Physics Letters, vol. 78, No. 4, pp. 410-412, Jan. 22, 2001.

S. M. Sze, Physics of Semiconduct of Devices, Second Edition, John Wiley & Sons, Inc. 1981.

(Continued)

*Primary Examiner*—Hung Vu
(74) *Attorney, Agent, or Firm*—Kent S. Kokko

(57) ABSTRACT

An organic Schottky diode includes a polycrystalline organic semiconductor layer with a rectifying contact on one side of the layer. An amorphous doped semiconductor layer is placed on the other side of the polycrystalline organic semiconductor layer, and it acts as a buffer between the semiconductor layer and an ohmic contact layer.

27 Claims, 5 Drawing Sheets

OTHER PUBLICATIONS

Y. S. Lee, J. H. Park, J. S. Choi, "Electrical Characteristics Of Pentacene-Based Schottky Diodes", Optical Materials, vol. 21, pp. 433-437, 2002.

J. Blochwitz, M. Pfeiffer, T. Fritz, K. Leo, "Low Voltage Organic Light Emitting Diodes Featuring Doped Phthalocyanine As Hole Transport Material", Applied Physics Letters, vol. 73, No. 6, pp. 729-731, Aug. 10, 1998.

J. Dreschel, M. Pfeiffer, X. Zhou, A. Nollau, K. Leo, "Organic Mip-Diodes By p-Doping Of Amorphous Wide-Gap Semiconductors: CV and Impedance Spectroscopy", Synthetic Metals, vol. 127, pp. 201-205, Mar. 2002.

A. R. Brown, D. M. de Leeuw, E. E. Havinga, A. Pomp, "A Universal Relation Between Conductivity And Field-Effect Mobility In Doped Amorphous Organic Semiconductors", Synthetic Metals, vol. 68, pp. 65-70, 1994.

C. P. Jarrett, R. H. Friend, A. R. Brown, and D. M. de Leeuw, "Field Effect Measurements In Doped Conjugated Polymer Films: Assessment Of Charge Carrier Mobilities", Journal of Applied Physics, vol. 77, No. 12, pp. 6289-6294, Jun. 15, 1995.

J. Paloheimo, P. Kulvalainen, H. Stubb, E. Vuorimaa, and P. Yli-Lahti, Appl. Phys. Lett., "Molecular Field-Effect Transistors Using Conducting Polymer Langmuir-Blodgett Films", vol. 56, No. 12, pp. 1157-1159, Mar. 19, 1990.

K. Hoshimono, S. Fujimori, S. Fujita, and S. Fujita, "Semiconductor-Like Carrier Conduction and Its Field-Effect Mobility in Metal-Doped $C_{60}$ Think Films", Japanese Journal of Applied. Physics, vol. 32, No. 8A, pp. L1070-L1073, Aug. 1, 1993.

A. Nollau, M. Pfeiffer, T. Fritz, and K. Leo. Journal of Applied Physics, "Controlled $n$-Type Of Doping Of A Molecular Organic Semiconductor: Naphthalenetetracarboxylic Dianhydride (NTCDA) Doped With bis(ethylenedithio)-tetrathiafulvalene (BEDT-TTF)", vol. 87, No. 9, pp. 4340-4343, May 1, 2000.

A. Werner, F. Li, K. Harada, M. Pfeiffer, T. Fritz, K. Leo, and S. Machill, "n-Type Doping of Organic Thin Films Using Cationic Dyes", Advanced Functional Materials, vol. 14, No. 3, pp. 255-260, Mar. 2004.

Z. Bao, A. J. Lovinger, and J. Brown, "New Air-Stable $n$-Channel Organic Thin Film Transistors", Journal of the American Chemical Society, vol. 120, No. 1, pp. 207-208, 1998.

P. R. L. Malenfant, C. D. Dimitrakopoulos, J. Gelorme, L. L. Kosbar, and T. O. Graham, "N-Type Organic Thin-Film Transistor With High Field-Effect Mobility Based On A N,N'-dialkyl-3,4,9,10-perylene Tetracarboxylic Diimide Derivative", Applied Physics Letters, vol. 80, No. 14, pp. 2517-2529, Apr. 8, 2002.

U.S. Appl. No. 10/620,027 filed Jul. 15, 2003, entitled "Bis(2-Acenyl)Acetylene Semiconductors".

U.S. Appl. No. 10/641,730, filed Aug. 15, 2003, entitled "Acene-Thiophene Semiconductors".

Pfeiffer, "Doped Organic Semiconductors: Physics and Application in Light Emitting Diodes", Organic Electronics, (2003), pp. 89-103, vol. 4, Elsevier B. V.

Blochwitz, "Non-Polymeric OLEDs With a Doped Amorphous Hole Transport Layer and Operating Voltages Down to 3.2 V to Achieve 100 $cd/m^2$", Synthetic Metals, (2002), pp. 169-173, vol. 127, Elsevier Science B. V.

Roman, "Polymer Diodes With High Rectification", Applied Physics Letters, (Nov. 29, 1999), pp. 3557-3559, vol. 75, No. 22, American Institute of Physics.

Ouyang, "On the Mechanism of Conductivity Enhancement in Poly(3,4-ethylenedioxythiophene):Poly(styrene sulfonate) Film Through Solvent Treatment", Polymer, (2004), pp. 8443-8450, vol. 45.

Ionescu-Zanetti, "Semiconductive Polymer Blends: Correlating Structure With Transport Properties at the Nanoscale", Advanced Materials, (Mar. 5, 2004), pp. 385-389, vol. 16, No. 5, Wiley-VCH Verlag GmbH & Co. KgaA, Weinheim.

ORGANIC SCHOTTKY DIODE

FIELD

This invention relates to a Schottky diode that incorporates a buffer layer between an ohmic contact layer and an organic semiconductor layer.

BACKGROUND OF THE INVENTION

The metal-semiconductor junction plays an important role in all solid state devices. A metal-semiconductor junction can be either a rectifying contact or an ohmic contact. Ideally, an ohmic contact displays a linear relationship between current and voltage. A rectifying contact displays a superlinear relationship between current and voltage. In practice, a rectifying contact may be used to create a diode. A diode acts as a sort of electronic valve, allowing a large amount of current to flow in one direction of a circuit, while allowing a negligible amount of current to flow in the opposite direction. A diode requires a certain amount of voltage to be applied across it before significant current will flow. This voltage is referred to as the "forward operating voltage", $V_f$ and is defined as the forward bias required to pass a specified forward current (or current density) through the diode. While a diode generally will not allow significant current flow in the reverse direction, if a large enough reverse bias is applied, the diode will allow significant amounts of current to flow in the reverse direction. This reverse bias is commonly referred to as the breakdown voltage and is defined to be the voltage at which a specified reverse current (or current density) is passed through the diode.

One type of diode, commonly called the Schottky diode, is made from the junction of a metal and a semiconductor. A typical Schottky diode consists of a semiconductor sandwiched between two different metals. One metal forms an ohmic contact to the semiconductor, while the other metal forms a rectifying contact to the semiconductor.

Semiconductors utilize electrons and holes as carriers. A semiconductor that has electrons as the majority carrier is usually referred to as an n-type semiconductor, or as having electron-type conductivity. A semiconductor that has holes as the majority carrier is usually referred to as a p-type semiconductor, or as having hole-type conductivity.

For electron transport in an organic semiconductor, a rectifying contact is formed when the Fermi energy of the metal is lower than the energy of the conduction band edge of the semiconductor. The conduction band edge is also commonly referred to as the Lowest Unoccupied Molecular Orbital (LUMO) of the semiconductor. An ohmic contact for electron transport in an organic semiconductor is formed when the Fermi energy of the metal is higher than the conduction band edge of the semiconductor. Alternatively, an ohmic contact may be formed by heavily n-type doping the semiconductor adjacent the ohmic contact metal. (See S. M. Sze, *Physics of Semiconductor Devices*, 1981). The opposite situation applies to hole transport in organic semiconductors. An ohmic contact for hole transport in an organic semiconductor is formed when the Fermi energy of the metal is lower than the energy of the valence band edge, also referred to as the Highest Occupied Molecular Orbital (HOMO), of the semiconductor. An ohmic contact for hole transport may also be formed by heavily p-type doping the semiconductor adjacent the ohmic contact metal. A rectifying contact is formed for hole transport in an organic semiconductor when the Fermi energy of the metal is higher than energy of the valence band edge of the semiconductor.

Traditionally, inorganic silicon and gallium arsenide semiconductors have dominated the semiconductor industry. In recent years, however, there has been an increasing desire to use organic semiconductors as an alternative to the traditional inorganic semiconductors. One organic semiconductor is pentacene, a π-conjugated molecule. In its polycrystalline form, pentacene has relatively high hole mobility parallel to the surface of film for an organic semiconductor. The valence band edge of pentacene is about 4.9 eV below the vacuum level. Therefore, gold, with a work function of 5.1 eV, forms an ohmic contact for holes with pentacene, while aluminum, with a work function of 4.3 eV, creates a rectifying contact for holes with pentacene.

Schottky diodes have been made using organic semiconductors, including pentacene (Y. S Lee, J. H Park, J. S. Choi, *Optical Materials*, 21, 433–437, (2002)). However, unlike inorganic semiconductors, organic semiconductors are not usually doped in order to achieve their carrier transport properties. Controlled doping to influence the electrical properties of organic transport layers is a new development. Substances like polycrystalline phthalocyananines and amorphous 4,4',4"-tris(N,N-diphenyl-amino)triphenylamine (TDATA) can be doped with the strong organic acceptor tetrafluoro-tetracyanoquinodimethane ($F_4$-TCNQ), resulting in conductivity much larger than the undoped material. (M. Pfeffer, A. Beyer, T. Fritz, K. Leo, *Appl. Phys. Lett*, 7, 729, (1998)).

Organic light-emitting diodes (OLEDs) have received much attention in recent years. Very low operating voltage multi-layered OLEDs have been achieved by combining a thick doped hole transport layer of TDATA with a thin undoped buffer layer of triphenyl-diamine (TPD). This structure resulted in OLEDs with a lower operating voltage and an improved electroluminescent efficiency compared to undoped devices. (X. Zhou, M. Pfeiffer, J. Blochwitz, A. Werner, A. Nollau, T. Fritz, K. Leo, *Appl. Phys. Lett*, 78 410–412, (2001)).

Use of doped amorphous materials has also been applied to metal/intrinsic/p-doped (Mip) diodes using 4,4',4"-tris(3-methylphenylphenyl amino) triphenyl-amine (MTDATA) in its intrinsic form, as well as doped with $F_4$-TCNQ. Conductivity was shown to increase with increased doping of MTDATA, and both the breakdown voltage and forward voltage of the Mip diode could be increased by thickening the intrinsic layer. (J. Dreschel, M. Pfeiffer, X. Zhou, A. Nollau, K. Leo, *Synthetic Metals* 127, 201–05, (2002)).

A typical organic Schottky diode, such as one made with gold, pentacene and aluminum, exhibits three significant characteristics: (1) it has a low forward voltage in the forward-bias mode; (2) it has a low breakdown voltage in the reverse bias mode; and (3) the device is not robust, and it is easy to get short circuits in practical applications. For certain electronic applications, such as radio frequency identification (RFID) tags, a much higher breakdown voltage is required, while maintaining a relatively low forward voltage. Also, more robust devices that do not get short circuits are also desirable.

SUMMARY

Briefly, the present invention is an organic Schottky diode that includes a doped buffer layer between the organic semiconductor and the ohmic contact. It has been discovered that adding a doped buffer layer between the ohmic contact and the organic semiconductor greatly increases the magnitude of the breakdown voltage with a relatively small increase in the magnitude of the forward voltage. In addition, the use of a doped buffer layer between the ohmic contact and the organic semiconductor creates a more robust device by preventing spiking of the ohmic contact through the organic semiconductor, thereby increasing the yield of useful devices.

The figures may not be drawn to scale. While the above-identified drawing figures set forth embodiments of the invention, other embodiments are also contemplated, as noted in the discussion. In all cases, this disclosure presents the invention by way of representation, and not limitation. It should be understood that numerous other modifications and embodiments that fall within the scope and spirit of the principals of this invention can be devised by those skilled in the art.

DETAILED DESCRIPTION

Figure 1:
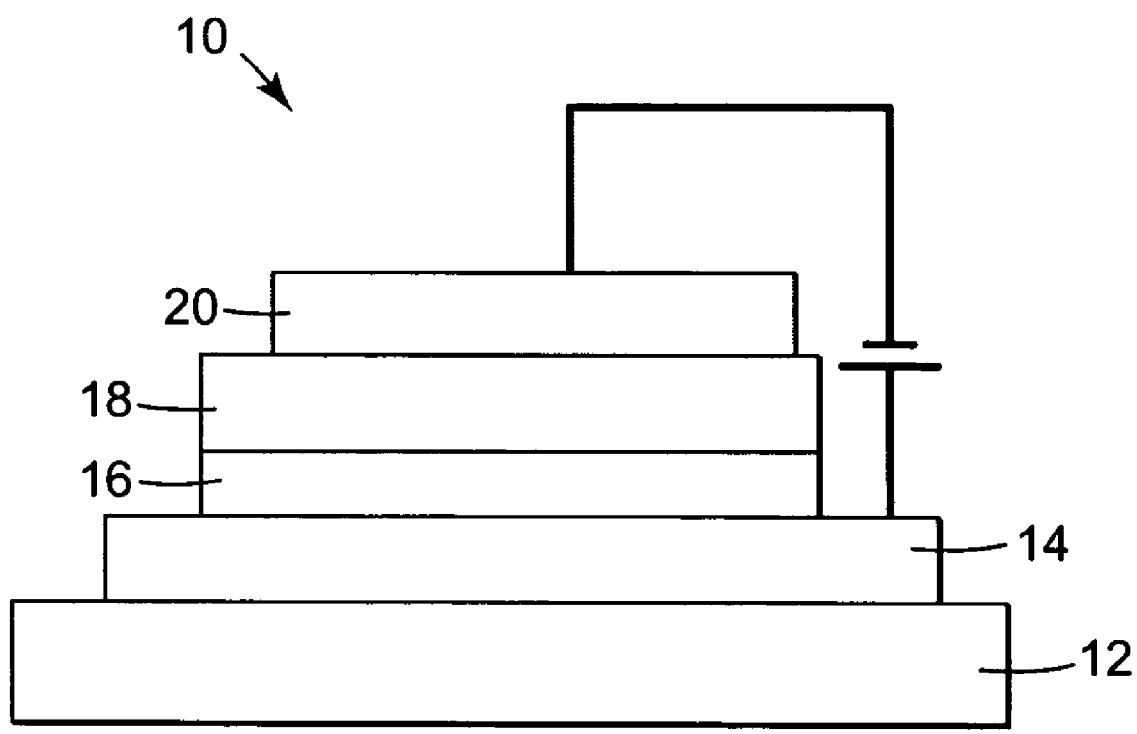
FIG. 1 is a profile of an organic Schottky diode with a doped buffer layer between the ohmic contact and organic semiconductor.

FIG. 1 shows organic Schottky diode 10 of the present invention. Diode 10 includes substrate 12, ohmic contact 14, doped buffer layer 16, polycrystalline organic semiconductor layer 18, and Schottky contact 20.

Ohmic contact 14 is placed on substrate 12. Ohmic contact 14 is made of a material that has a suitable work function with respect to doped buffer layer 16. If Schottky diode 10 is to operate by hole transport, then ohmic contact 14 preferably has a large work function suitable for injecting holes into buffer layer 16. If Schottky diode 10 is to operate by electron transport, then ohmic contact 14 preferably has a low work function suitable for injecting electrons into buffer layer 16. For example, gold forms an ohmic contact with many p-type organic semiconductors.

On top of ohmic contact 14 is placed doped buffer layer 16. For example, 4,4',4"-tris (3-methylphenylphenyl amino) triphenylamine (MTDATA) may be used to make buffer layer 16 if organic semiconductor layer 18 is a p-type material. MTDATA is a stable amorphous glass that functions as a hole transport material for organic light-emitting diodes. Its glass transition temperature is ~75° C. and its melting point is ~203° C. Its undoped conductivity is $10^{-10}$ S/cm at room temperature.

Because of the low conductivity of undoped amorphous MTDATA, the contact resistance from the ohmic contact layer to the semiconductor layer would be much higher for the diode structure inserting this layer between the gold and the pentacene layers than for one without this buffer layer. This would cause an unacceptably high forward voltage. To overcome this problem, the layer of MTDATA is doped to greatly increase its conductivity. MTDATA may be doped by co-subliming it with acceptor molecules of the fluorinated form of tetracyanoquinodimethane ($F_4$-TCNQ). Doping concentrations of 3–20% $F_4$-TCNQ in MTDATA are effective, with doping concentrations of about 5% to about 10% $F_4$-TCNQ in MTDATA providing best results.

Doped buffer layer 16 may also be made of other materials. If organic semiconductor 18 is made with a p-type semiconductor, then other p-type doped, amorphous materials may be used to make doped buffer layer 16, including: tetracyanoquinodimethethane (TCNQ) doped with tetrathiofulvalene (TTF) (A. R. Brown, D. M. de Leeuw, E. E. Havinga, A. Pomp, *Synthetic Metals*, 68, 65–70, (1994)); poly(β'-dodecyloxy(-α,α',-α',α")terthienyl) (polyDOT$_3$) doped with 2,3-dichloro-5,6-dicyano-1,4-benoquinone (DDQ) (C. P. Jarrett, R. H. Friend, A. R. Brown, and D. M. de Leeuw, *J. Appl. Phys.*, 77, 6289–6294, (1995)); poly(3-hexylthiophene) (PHT) or quinquethiophene (QT) doped with arachidic acid (J. Paloheimo, P. Kulvalainen, H. Stubb, E. Vuorimaa, and P. Yli-Lahti, *Appl. Phys. Lett.*, 56, 1157–1159, (1990)); lutetium and thulium bisphthalocyanines exposed to air to react with $O_2$ (G. Guilllaud, M. A L Sadoun, M. Maitrot, J. Simon, and M. Bouvet, *Chem. Phys. Lett.*, 167, 503–506, (1990)); or $C_{60}$ doped with indium or antimony (K. Hoshimono, S. Fujimori, S. Fujita, and S. Fujita, *Jpn. J. Appl. Phys.*, 32, L1070–L1073, (1993)). If organic semiconductor 18 is made with an n-type semiconductor, then doped buffer layer 16 must be made of an n-type doped, amorphous material, such as naphthalenetetracarboxylic dianhydride (NTCDA) doped with bis(ethylenedithio)-tetrathiafulvalene (BEDT-TTF) (A. Nollau, M. Pfeiffer, T. Fritz, and K. Leo, *J. Appl. Phys.*, 87, 4340–4343, (2000)) or cationic dye pronin B chloride (A. Werner, F. Li, K. Harada, M. Pfeiffer, T. Fritz, K. Leo, and S. Machill, *Adv. Funct. Mater.*, 14, 255–260, (2004)).

Organic semiconductor 18 is placed on top of doped buffer layer 16. The organic semiconductor has a polycrystalline structure and is made of any material that provides suitable semiconducting properties. Pentacene is a desirable organic semiconductor because of its relatively high carrier mobility. However, other p-type organic semiconductors could also be used, including: metal-free phthalocyanine (e.g., $H_2Pc$) and metallophthalocyanine (wherein the metal is copper, vanadyl (VO), nickel, iron, lead, zinc, magnesium, or cobalt); fullerene ($C_{60}$) doped with indium or antimony; polyaniline; polypyrrole; poly(p-phenylene); poly(p-phenylenevinylene); substituted pentacene compounds, which are described in Assignee's co-pending application U.S. Ser. No. 10/256,616, published as U.S. 2003-0105365; bis(2-acenyl)acetylene compounds, which are described in Assignee's co-pending application U.S. Ser. No. 10/620, 027; or acene-thiophene compounds, which are described in Assignee's co-pending application U.S. Ser. No. 10/641, 730, all of which are incorporated by reference herein. Organic semiconductor 18 may also be made of an n-type organic semiconductor, including: hexadecahalogenated metallophthalocyanines, such as $F_{16}CuPc$, $F_{16}ZnPc$, $F_{16}FePc$, and $F_{16}CoPc$ (Z. Bao, A. J. Lovinger, and J. Brown, *J. Am. Chem. Soc.*, 120, 207–208, (1998)); or N,N'-dioctyl-3,4,9,10-perylene tetracarboxylic diimide (PTCDI-C8H) (P. R. L. Malenfant, C. D. Dimitrakopoulos, J. Gelorme, L. L. Kosbar, and T. O. Graham, *Appl. Phys. Lett.*, 80, 2517–2519, (2002)).

Schottky contact 20 is placed on top of organic semiconductor 18. Schottky contact 20 is made of material that has a suitable work function with respect to organic semiconductor 18. If Schottky diode 10 operates by hole transport, then Schottky contact 20 must have a Fermi energy higher than the valence band edge of organic semiconductor layer 18. If Schottky diode 10 operates by electron transport, then Schottky contact 20 must have a Fermi energy less than the conduction band edge of organic semiconductor layer 18. For instance, aluminum forms a Schottky contact with respect to hole transport in pentacene.

In building organic semiconductor diodes, one problem is spiking. No surface is perfectly smooth. When a thin layer of semiconducting material is placed between two layers of metal, the metal may spike through the semiconductor and come into direct contact with the other metal. This creates an undesirable short circuit through the semiconductor.

Buffer layer 16 is made from an amorphous material. As a result, buffer layer 16 smoothes out the rougher surface of ohmic contact 14. Buffer layer 16 also increases the distance between ohmic contact 14 and Schottky contact 20. Using a thicker layer of organic semiconductor 18 would also increase the distance between ohmic contact 14 and Schottky contact 20. However, the thicker undoped organic semiconductor layer would also increase the forward voltage of diode 10, which is undesirable. The addition of buffer layer 16 decreases the probability of spiking, thus making the device more robust, while maintaining a relatively low forward voltage. Buffer layer 16 is at least 1500 Å thick, and it may be as thick as 10,000 Å. Optimal performance is achieved with buffer layer 16 between 2000 Å and 5000 Å.

Figure 2:
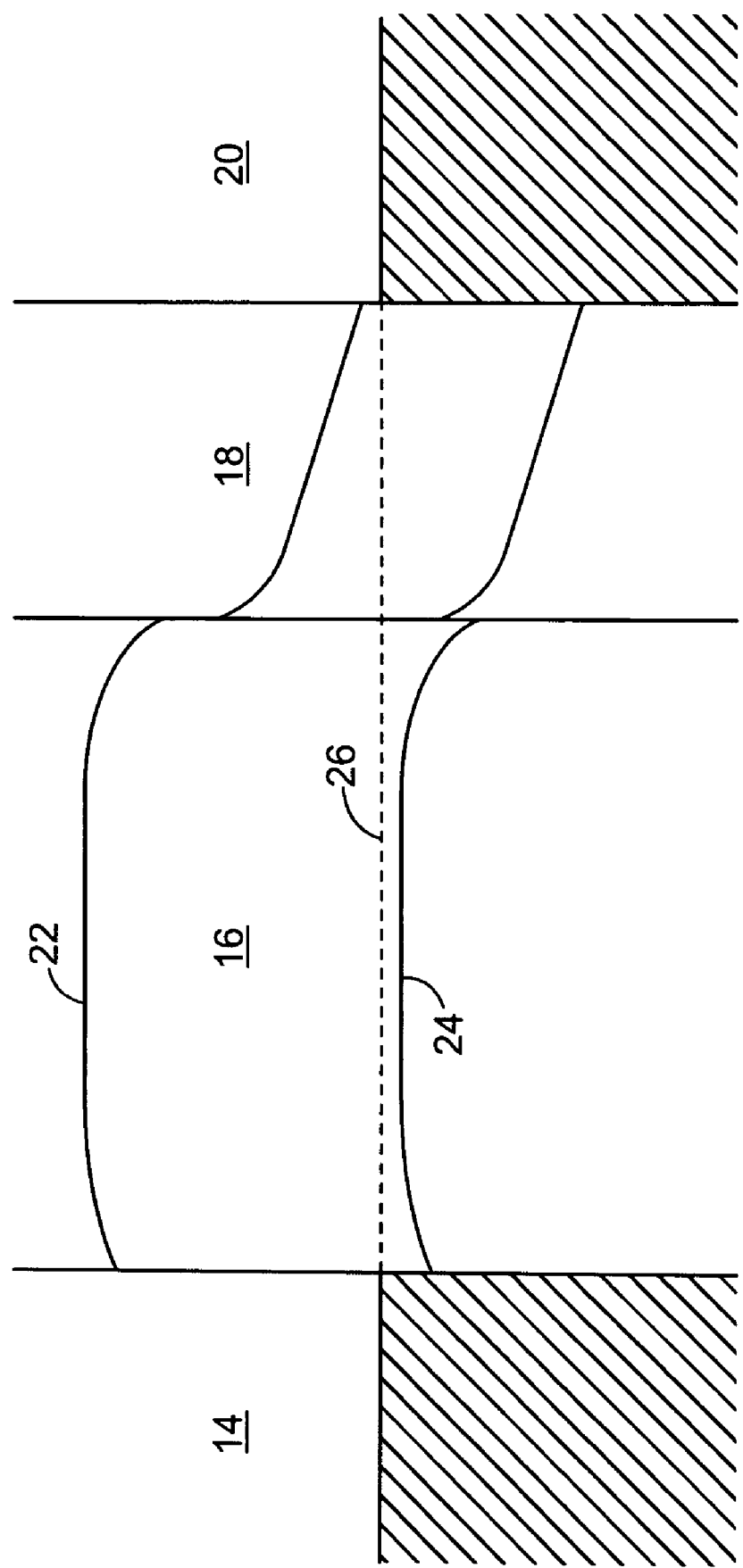
FIG. 2 is an energy band diagram of an organic Schottky diode with a doped buffer layer between the ohmic contact and the organic semiconductor.

FIG. 2 shows an energy band diagram for organic Schottky diode 10 in its equilibrium state. The figure includes ohmic contact 14, doped buffer layer 16, organic semiconductor 18, rectifying contact 20, LUMO energy 22, HOMO energy 24 and Fermi energy 26. Holes are injected from ohmic contact 14 to doped buffer layer 16. The holes travel through doped buffer layer 16 into organic semiconductor 18. The holes travel through organic semiconductor 18 to rectifying contact 20. When organic Schottky diode 10 is forwardly biased, the barrier between organic semiconductor 18 and rectifying contact 20 is reduced by the forward bias, allowing the holes to flow freely from organic semiconductor 18 to rectifying contact 20. In contrast, when a reverse bias is applied to organic Schottky diode 10, the barrier between organic semiconductor 18 and rectifying contact 20 prevents the flow of holes in the reverse direction.

EXAMPLES

Objects and advantages of this invention are further illustrated by the following examples, but the particular materials and amounts thereof in these examples, as well as other conditions and details, should not be construed to unduly limit this invention.

Example 1

Figure 3:
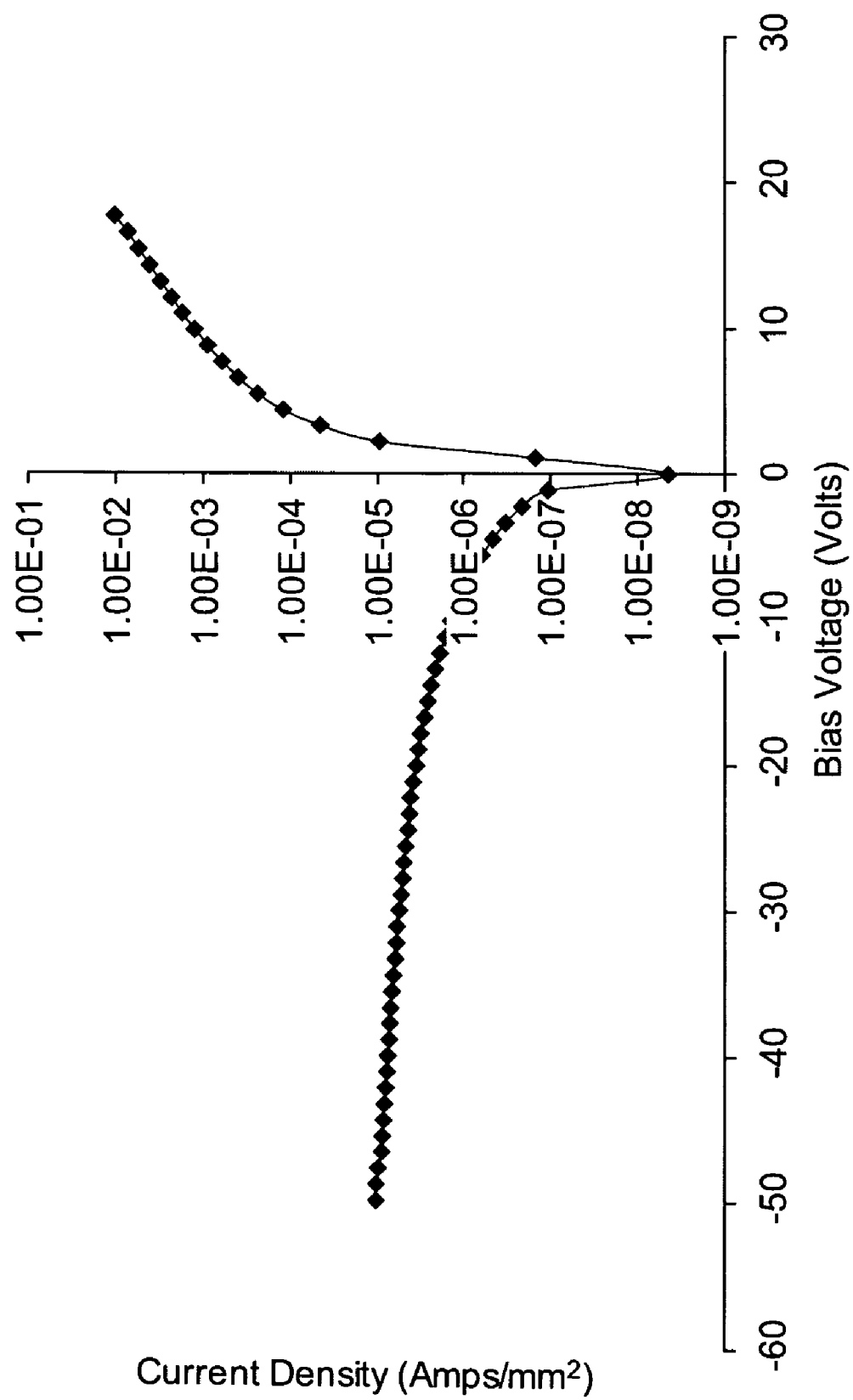
FIG. 3 is a plot of the current-voltage (I-V) relationship for an organic Schottky diode with a buffer layer of MTDATA doped with 5–7% $F_4$-TCNQ between the ohmic contact and the organic semiconductor (Example 1).

FIG. 3 shows a typical I-V curve for an organic Schottky diode that includes a doped buffer layer between the semiconductor layer and the ohmic contact layer. In FIG. 3, the absolute value of current density is plotted along the vertical axis, and bias voltage is plotted along the horizontal axis. This particular diode has an ohmic contact made of 30 Å of titanium and 600 Å of gold, a doped buffer layer made of 3500 Å of MTDATA doped with 5–7% of $F_4$-TCNQ, an organic semiconductor layer made of 3000 Å of pentacene, and a rectifying contact made of 2000 Å of aluminum. A much improved breakdown voltage is observed on the reverse bias side. Even at −50 volts, the leakage current density is still maintained at $10^{-5}$ A/mm$^2$.

Example 2

Figure 4:
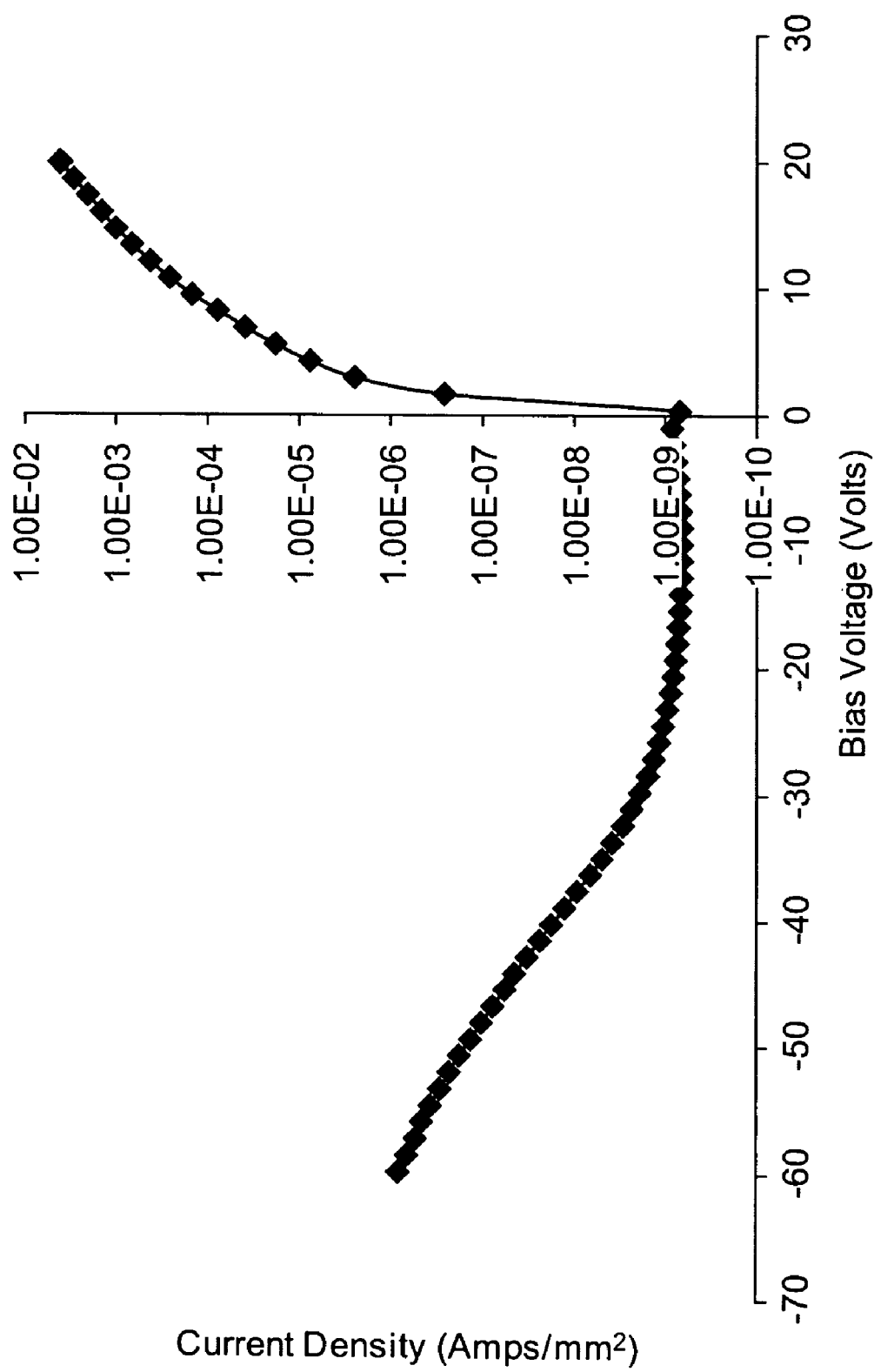
FIG. 4 is a plot of the I-V relationship for an organic Schottky diode with a buffer layer of MTDATA doped with <5% $F_4$-TCNQ between the ohmic contact and the organic semiconductor (Example 2).

The dopant concentration in doped buffer layer 16 affects both forward voltage and breakdown voltage. FIG. 4 shows an organic Schottky diode that has an ohmic contact made of 20 Å of titanium and 500 Å of gold, a doped buffer layer made of 3200 Å of MTDATA doped with less than 5% of $F_4$-TCNQ, an organic semiconductor layer made of 4900 Å of pentacene, and a rectifying contact made of 2000 Å of aluminum. This device has a structure similar to that of the device shown in FIG. 3, except that the doping level of $F_4$-TCNQ in the MTDATA is smaller. In FIG. 4, the absolute value of current density is plotted along the vertical axis, and bias voltage is plotted along the horizontal axis. With this lower level of doping, an even better breakdown voltage of more than −60 volts is achieved. However, the forward voltage increases to 15 volts.

Comparative Example A

Figure 5:
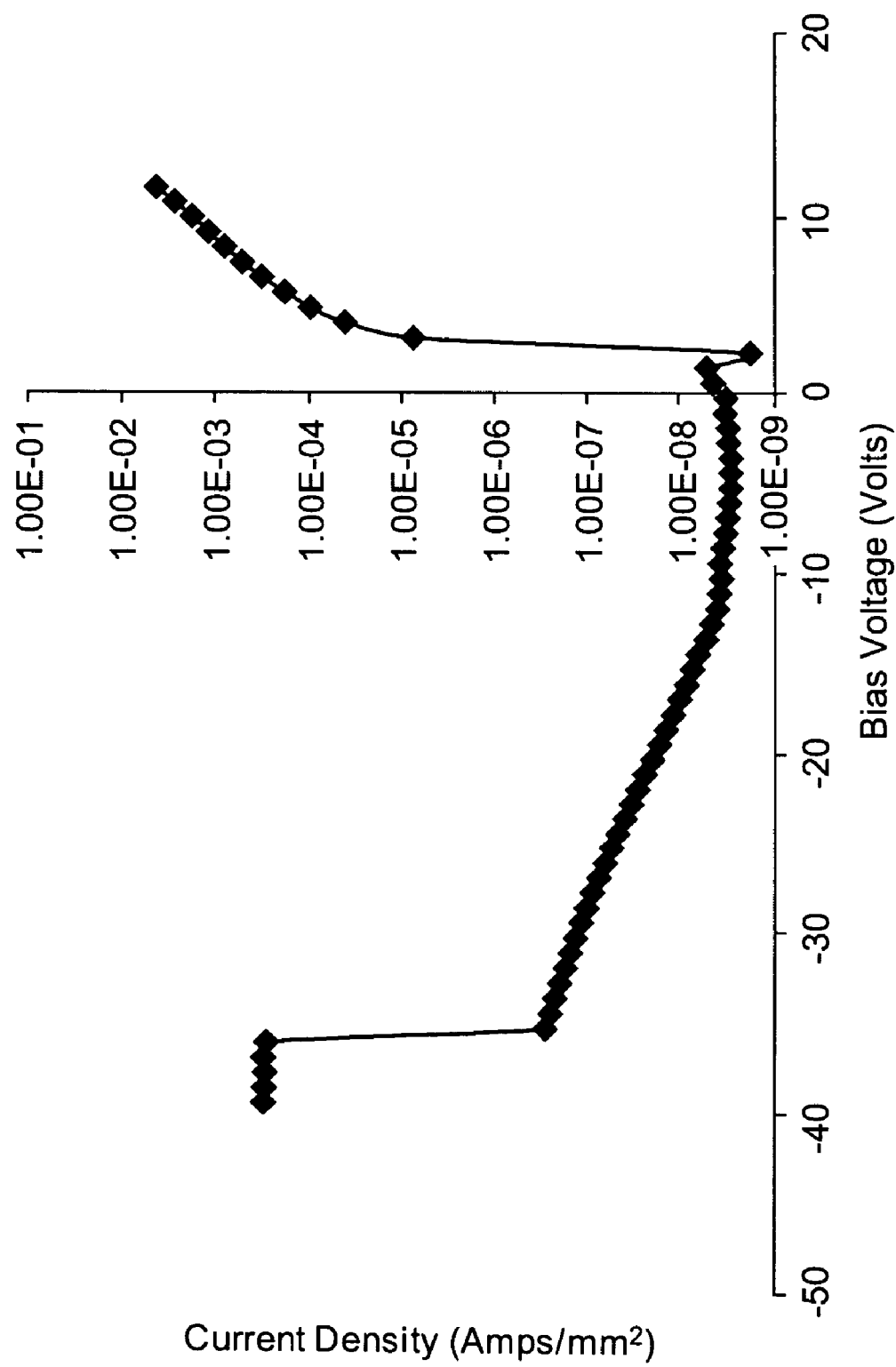
FIG. 5 is a plot of the I-V relationship for an organic Schottky diode without a buffer layer between the ohmic contact and the organic semiconductor (Comparative Example A).

For comparison, FIG. 5 shows an organic Schottky diode made without doped buffer layer 16. This particular diode has an ohmic contact made of 20 Å of titanium and 550 Å of gold, an organic semiconductor layer made of 4900 Å of pentacene, and a rectifying contact made of 2000 Å of aluminum. In FIG. 5, the absolute value of current density is plotted along the vertical axis, and bias voltage is plotted along the horizontal axis.

Comparing FIG. 3 with FIG. 5, the organic Schottky diode that includes doped buffer layer 16 (FIG. 3) shows an improved breakdown voltage of beyond −50 volts, compared with a breakdown voltage of −36 volts for the traditional Schottky diode (FIG. 5). Yet the diode whose I-V curve is shown in FIG. 3 still exhibits a low forward voltage of about 9 volts.

Examples 3–5

In general, the level of doping will affect both the forward voltage and the breakdown voltage. To increase the breakdown voltage, which is generally desirable, one must also increase the forward voltage, which is generally undesirable. Table 1 summarizes the effect of doping MTDATA with $F_4$-TCNQ on the forward voltage and the breakdown voltage.

TABLE 1

| Example | % of Doping | Thickness of Buffer Layer (Å) | Thickness of Pentacene (Å) | Forward Voltage (volts) @$10^{-3}$ amps/mm$^2$ | Reverse-bias Current Density |
|---|---|---|---|---|---|
| 1 | 5–7% | 3500 | 3000 | 9.2 | ~7.5 × $10^{-6}$ A/mm$^2$ @ −40 V |
|   |      |      |      |     | ~1.0 × $10^{-5}$ A/mm$^2$ @ −50 V |
| 2 | Less than 5% | 3200 | 4900 | 14.8 | 8.2 × $10^{-7}$ A/mm$^2$ @ −60 V |
| 3 | 5% | 3000 | 4000 | 5–7 | ~3.5 × $10^{-5}$ A/mm$^2$ @ −40 V |
|   |    |      |      |     | ~8.3 × $10^{-5}$ A/mm$^2$ @ −45 V |

TABLE 1-continued

| Example | % of Doping | Thickness of Buffer Layer (Å) | Thickness of Pentacene (Å) | Forward Voltage (volts) @$10^{-3}$ amps/mm² | Reverse-bias Current Density |
|---|---|---|---|---|---|
| 4 | 14% for the initial 350 Å leveling off to 5% for the remaining 2650 Å | 3000 | 4830 | 12.1 | ~$1.1 \times 10^{-5}$ A/mm² @ −40 V |
| 5 | ~5% (% fluctuated) | 3760 | 4970 | 17.5–21 | ~$6 \times 10^{-8}$ A/mm² @ −40 V<br>~$1.3 \times 10^{-6}$ A/mm² @ −60 V |
| A | None | None | 4900 | 5.7 | Breakdown occurred at −36 V |

Adding a doped buffer layer between the ohmic contact and the semiconductor layer of an organic Schottky diode greatly enhances the breakdown voltage of the device, while still maintaining a forward voltage at a practical level. In addition, the added buffer layer prevents spiking between the ohmic contact and the Schottky contact, thereby creating a more robust device and increasing the yield of useful devices.

Although the present invention has been described with reference to preferred embodiments, workers skilled in the art will recognize that changes may be made in form and detail without departing from the spirit and scope of the invention. For example, the whole sequence of the structure above the substrate shown in FIG. 1 may be reversed and may still achieve the same improved performance.

The invention claimed is:

1. A Schottky diode comprising:
   a polycrystalline organic semiconductor layer;
   a rectifying contact on a first surface of the organic semiconductor layer;
   a doped buffer layer in contact with a second surface of the organic semiconductor layer, the doped buffer layer formed of an amorphous doped organic semiconductor; and
   an ohmic contact to the doped buffer layer.

2. The Schottky diode of claim 1 wherein the organic semiconductor layer is a π-conjugated polymer.

3. The Schottky diode of claim 1 wherein the organic semiconductor layer is chosen from a group consisting of pentacene, metal-free phthalocyanine, fullerene doped with indium or antimony, polyaniline, polypyrrole, poly(p-phenylene), poly(p-phenylenevinylene), a substituted pentacene compound, a bis(2-acenyl)acetylene compound, an acenethiophene compound, $F_{16}$CuPc, $F_{16}$ZnPc, $F_{16}$FePc, $F_{16}$CoPc and N,N'-dioctyl-3,4,9,10-perylene tetracarboxylic diimide.

4. The Schottky diode of claim 1 wherein the amorphous organic semiconductor has a thickness between 1500 and 10,000 angstroms.

5. The Schottky diode of claim 4 wherein the amorphous organic semiconductor has a thickness between 3000 and 3500 angstroms.

6. The Schottky diode of claim 1 wherein the amorphous organic semiconductor is MTDATA.

7. The Schottky diode of claim 6 wherein the MTDATA is doped with $F_4$-TCNQ.

8. The Schottky diode of claim 7 wherein the MTDATA is doped with 3–20% $F_4$-TCNQ.

9. The Schottky diode of claim 8 wherein the MTDATA is doped with 5–10% $F_4$-TCNQ.

10. A Schottky diode comprising:
    a substrate;
    an ohmic contact with a first surface in contact with a first surface of the substrate;
    a doped buffer layer with a first surface in contact with a second surface of the ohmic contact, the doped buffer layer formed of an amorphous doped organic semiconductor;
    a polycrystalline organic semiconductor layer with a first surface in contact with a second surface of the doped buffer layer; and
    a rectifying contact with a first surface in contact with a second surface of the organic semiconductor layer.

11. The Schottky diode of claim 10 wherein the organic semiconductor layer is a π-conjugated polymer.

12. The Schottky diode of claim 10 wherein the organic semiconductor layer is chosen from a group consisting of pentacene, metal-free phthalocyanine, fullerene doped with indium or antimony, polyaniline, polypyrrole, poly(p-phenylene), poly(p-phenylenevinylene), a substituted pentacene compound, a bis(2-acenyl)acetylene compound, an acenethiophene compound, $F_{16}$CuPc, $F_{16}$ZnPc, $F_{16}$FePc, $F_{16}$CoPc and N,N'-dioctyl-3,4,9,10-perylene tetracarboxylic diimide.

13. The Schottky diode of claim 10 wherein the amorphous organic semiconductor has a thickness between 1500 and 10,000 angstroms.

14. The Schottky diode of claim 13 wherein the amorphous organic semiconductor has a thickness between 3000 and 3500 angstroms.

15. The Schottky diode of claim 10 wherein the amorphous semiconductor is MTDATA.

16. The Schottky diode of claim 15 wherein the MTDATA is doped with $F_4$-TCNQ.

17. The Schottky diode of claim 16 wherein the MTDATA is doped with 3–20% $F_4$-TCNQ.

18. The Schottky diode of claim 17 wherein the MTDATA is doped with 5–10% $F_4$-TCNQ.

19. A Schottky diode comprising:
    a substrate;
    a rectifying contact with a first surface in contact with a first surface of the substrate;
    a polycrystalline organic semiconductor layer with a first surface in contact with a second surface of the rectifying contact;

a doped buffer layer with a first surface in contact with a second surface of the polycrystalline organic semiconductor layer, the doped buffer layer formed of an amorphous doped organic semiconductor; and an ohmic contact with a first surface in contact with a second surface of the doped buffer layer.

20. The Schottky diode of claim 19 wherein the organic semiconductor layer is a π-conjugated polymer.

21. The Schottky diode of claim 19 wherein the organic semiconductor layer is chosen from a group consisting of pentacene, metal-free phthalocyanine fullerene doped with indium or antimony, polyaniline, polypyrrole, poly(p-phenylene), poly(p-phenylenevinylene), a substituted pentacene compound, a bis(2-acenyl)acetylene compound, an acenethiophene compound, $F_{16}CuPc$, $F_{16}ZnPc$, $F_{16}FePc$, $F_{16}CoPc$ and N,N'-dioctyl-3,4,9,10-perylene tetracarboxylic diimide.

22. The Schottky diode of claim 19 wherein the amorphous organic semiconductor has a thickness between 1500 and 10,000 angstroms.

23. The Schottky diode of claim 22 wherein the amorphous organic semiconductor has a thickness between 3000 and 3500 angstroms.

24. The Schottky diode of claim 19 wherein the amorphous organic semiconductor is MTDATA.

25. The Schottky diode of claim 24 wherein the MTDATA is doped with $F_4$-TCNQ.

26. The Schottky diode of claim 25 wherein the MTDATA is doped with 3–20% $F_4$-TCNQ.

27. The Schottky diode of claim 26 wherein the MTDATA is doped with 5–10% $F_4$-TCNQ.

* * * * *

UNITED STATES PATENT AND TRADEMARK OFFICE
CERTIFICATE OF CORRECTION

PATENT NO. : 7,193,291 B2  
APPLICATION NO. : 10/809135  
DATED : March 20, 2007  
INVENTOR(S) : Tzu-Chen Lee Page 1 of 1

It is certified that error appears in the above-identified patent and that said Letters Patent is hereby corrected as shown below:

Title Page, Item (56), in Col. 2, under (Other Publications)  
Line 16, delete "ing,"" and insert -- ing." --, therefor.

Title Page Item (56), in Col. 2, under (Other Publications)  
Line 12, delete "2517-2529" and insert -- 2517-2519 --, therefor.

Col. 2  
Line 28, after "Lett," delete "7," and insert -- 73, --, therefor.

Col. 4  
Line 25, delete "*Jpn.*" and insert -- *Jpn*, --, therefor.

Col. 7  
Line 50, in Claim 3, delete "phthalocyanine," and insert -- phthalocyanine and metallophthalocyanine, --, therefor.

Col. 8  
Line 40, in Claim 12, delete "phthalocyanine," and insert -- phthalocyanine and metallophthalocyanine, --, therefor.

Col. 9  
Line 11, in Claim 21, after "phthalocyanine" insert -- and metallophthalocyanine, --.

Signed and Sealed this

Thirty-first Day of July, 2007

JON W. DUDAS  
*Director of the United States Patent and Trademark Office*